United States Patent
Jen et al.

(10) Patent No.: US 8,334,517 B2
(45) Date of Patent: Dec. 18, 2012

(54) APPARATUS FOR ADJUSTING ION BEAM BY BENDED BAR MAGNETS

(75) Inventors: Ko-Chuan Jen, San Jose, CA (US); Zhimin Wan, Sunnyvale, CA (US)

(73) Assignee: Advanced Ion Beam Technology, Inc., Hsin-Chu (TW)

( * ) Notice: Subject to any disclaimer, the term of this patent is extended or adjusted under 35 U.S.C. 154(b) by 60 days.

(21) Appl. No.: 13/012,759

(22) Filed: Jan. 24, 2011

(65) Prior Publication Data

US 2012/0187290 A1    Jul. 26, 2012

(51) Int. Cl.
*H01J 3/24* (2006.01)
*G21K 5/04* (2006.01)

(52) U.S. Cl. ........ 250/396 ML; 250/492.21; 250/492.3; 250/396 R

(58) Field of Classification Search   250/396 R–396 ML
See application file for complete search history.

(56) References Cited

U.S. PATENT DOCUMENTS

| | | | |
|---|---|---|---|
| 3,120,609 A * | 2/1964 | Farrell | 250/396 R |
| 4,767,930 A * | 8/1988 | Stieber et al. | 250/396 ML |
| 6,452,197 B1 * | 9/2002 | Ito | 250/492.21 |
| 7,078,713 B2 | 7/2006 | White | |
| 7,112,789 B2 * | 9/2006 | White et al. | 250/294 |
| 7,326,941 B2 | 2/2008 | Chen et al. | |
| 7,807,986 B1 * | 10/2010 | Jen et al. | 250/492.21 |
| 8,035,087 B2 * | 10/2011 | White | 250/396 ML |
| 2008/0169426 A1 * | 7/2008 | Purser et al. | 250/396 ML |
| 2010/0001204 A1 | 1/2010 | White | |

* cited by examiner

*Primary Examiner* — Jack Berman
*Assistant Examiner* — David E Smith
(74) *Attorney, Agent, or Firm* — Stout, Uxa, Buyan & Mullins, LLP

(57) ABSTRACT

Apparatus and method for adjusting an ion beam between a mass analyzer and a substrate holder. Herein, one or more bended, such as arch-shaped, curved or zigzag shaped, bar magnets are configured to apply one or more magnetic fields to adjust the shape or cross section of an ion beam passing through a space partially surrounded by the one or more bended bar magnets. At least one of the gap width between neighbor bended bar magnets, the curvature of each bended bar magnet and the current flowing through each bended bar magnet may be fixed or adjusted dependently or independently. Therefore, the Lorentz force applied on the ion beam along different directions may be changed in a desired manner, and then the ion beam may be flexibly elongated, compressed or shaped to meet the process requirement.

9 Claims, 9 Drawing Sheets ten# APPARATUS FOR ADJUSTING ION BEAM BY BENDED BAR MAGNETS

BACKGROUND OF THE INVENTION

1. Field of the Invention

The invention is concerned with ion beam adjustment, and directed particularly to adjust the ion beam between a mass analyzer and a workpiece by using one or more specific shaped magnetic fields.

2. Description of Related Art

Ion implantation is a ballistic process used to introduce into a substrate with ions, atoms or molecules, generally referred to as dopants, to make materials with useful properties. Of particular interest, ion implantation is a common process used in making modem integrated circuits. Ion implantation may also be used for other purpose, like thin film deposition or formation with controlled thickness and predefined surface properties for manufacturing optical display devices such as flat panel displays.

In general, an ion implanter has at least an ion source, a mass analyzer and a substrate holder. The ion source is used to ionize one or more material to generate numerous ions, and the mass analyzer is used to filter these ions so that the selected ion beam has only substantially ions with desired specific mass-to-charge ratio. Then, the workpiece held by the substrate holder is implanted by the selected ion beam. Herein, the workpiece can be a semiconductor substrate, a glass plate or other bulk materials.

In general, without further focusing or adjusting, the ion beam just exited from the mass analyzer would not have a desired shape and property other than corrected beam current and energy. For example, the cross-sectional shape of ion beam may be irregular, and the ion beam current distribution on the cross section may be non-uniform or far away from Gaussian distribution. Moreover, different implantations applications may prefer different ion beams with different shapes. For example, a narrower ion beam may be beneficial than a wider ion beam for implanting a region with more defined boundary on a workpiece. Accordingly, the ion implanter usually has one or more control assemblies which are capable of applying the magnetic field or the electromagnetic field on the ion beam in a region between the mass analyzer and the substrate holder. The trajectory of each charged particle, such as ion, in the ion beam will be affected by the applied magnetic/electromagnetic field, and then the properties of ion beam may be adjusted. For example, a diverse ion beam may be collimated, a ribbon shape ion beam may be focused to form a spot beam at the surface of the workpiece, and the ion beam current density distribution may be modified to become Gaussian-like distribution with beam width and height in the preferred rang by controlling the ion beam envelope.

There is a number of conventional control assemblies used in ion implanter. For example, as shown in FIG. 1A, one popular conventional control assembly has two mutual parallel straight bar magnets 11/12 having the coils 13 uniformly disposed on the straight support rods 14. Hence, by adjusting separately the electrical current directions through the coils 13, different magnet fields may elongate or compress the ion beam 15 (direction into the paper and vertical to the two straight bar magnets 11/12) when the ion beam is directed through a space between the straight bar magnets 11/12. Another conventional control assembly, as shown in FIG. 1B, is similar with the above except that the coils 13 are non-uniformly disposed on the straight support rods 14. Still another conventional control assembly, as shown in FIG. 1C, is similar with the above except that one additional straight bar magnet 16 is configured to mechanically connect the two straight bar magnets 11/12 for forming a U-shape magnet structure. Herein, the coils 13 may be uniformly or non-uniformly disposed on the additional straight bar magnet 16. One more conventional control assembly, as shown in FIG. 1D, is similar with the above except that two additional straight bar magnets 16/17 are configured to mechanically connect the two straight bar magnets 11/12 for forming a rectangle magnet structure. Herein, the coils 13 may be uniformly or non-uniformly disposed on the two additional straight bar magnets 16/17. Moreover, one or more electric element 18 may be disposed on one or two additional straight bar magnets 16/17 for further tuning the direction of the ion beam 15.

However, as well-known by the one skilled in the art, all conventional control assemblies have limitations for all potential implementations on a workpiece to cover the beam optics requirements to transportion beam at various beam current from light to heavy mass species and for ion energy from several tens keV down to as low as few hundred eV. Therefore, there is a need existed to propose a novel apparatus for adjusting an ion beam, after the ion beam is exited from the mass analyzer and before the workpiece on the substrate holder.

SUMMARY OF THE INVENTION

The present invention provides ion implanter capable of adjusting an ion beam by using one or more bended bar magnets. For example, arch-shaped bar magnet, curved bar magnet, zigzag shaped bar magnet and so on.

The fundamental difference between the proposed bended bar magnet(s) and the conventional straight bar magnet(s) is the capability to elongate or compress an ion beam not only along horizontal or perpendicular direction relative to ion beam path with different amplitude but also along different directions to change ion beam shape to a desired shape and beam size.

One feature of the invention is directed to an ion implanter having at least an ion source, a mass analyzer, a substrate holder and a control assembly. Both the functions and the structures of the ion source, the mass analyzer and the substrate holder can be similar with the conventional ion technologies, and the control assembly is capable of adjusting the ion beam within the adjustment space between the mass analyzer and the substrate holder. The control assembly has at least a first bended bar magnet having a first bended support rod and one or more first coils dispensed on the first bended support rod with one or more first currents flowing through the first coils, and a second bended bar magnet having a second bended support rod and one or more second coils dispensed on the second bended support rod with one or more second currents flowing through the second coils. Herein, the first bended bar magnet is at a gap from the second bended bar magnet to form the adjustment space between the first bended bar magnet and the second bended bar magnet.

DETAILED DESCRIPTION OF THE INVENTION

The bended bar magnet(s) is proposed to replace the conventional straight bar magnet(s), i.e., to form a control assembly having the bended bar magnet(s). The differences between the bended bar magnet and the straight bar magnet naturally induce different ratios of horizontal and vertical Lorentz forces, and then may adjust differently the ion beam. The ratio may be changed more significantly by changing the gap width between the two bended bar magnets, by changing the curvatures of these bended bar magnets, and/or by changing the currents flowing through the two bended bar magnets.

Figure 1A:
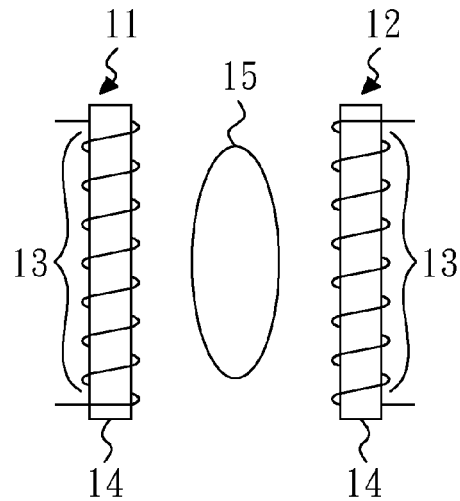
FIG. 1A to FIG. 1D illustrate qualitatively four conventional control assemblies.
Figure 1B:
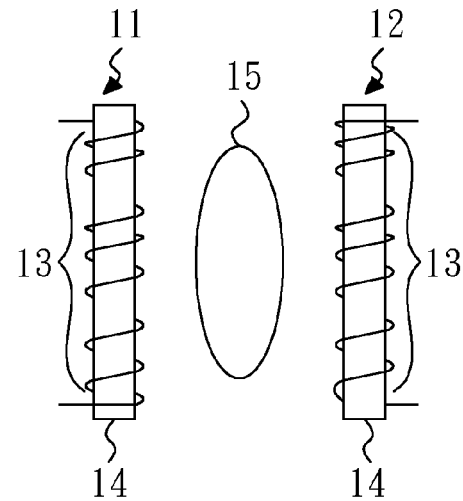
Figure 1C:
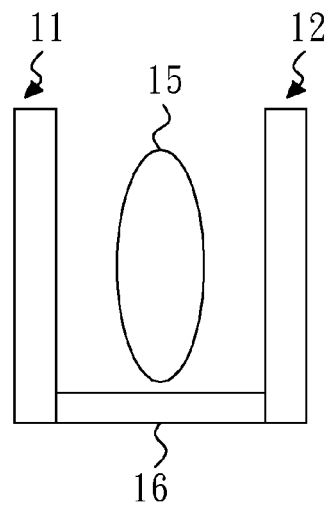
Figure 1D:
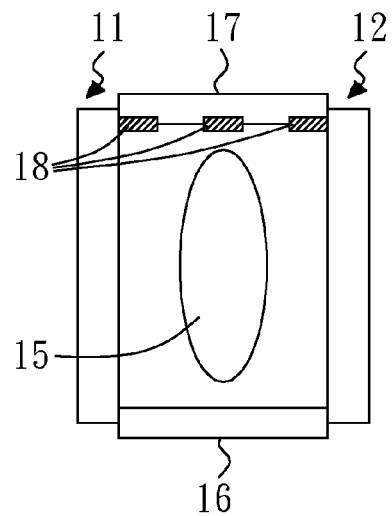
Figure 2A:
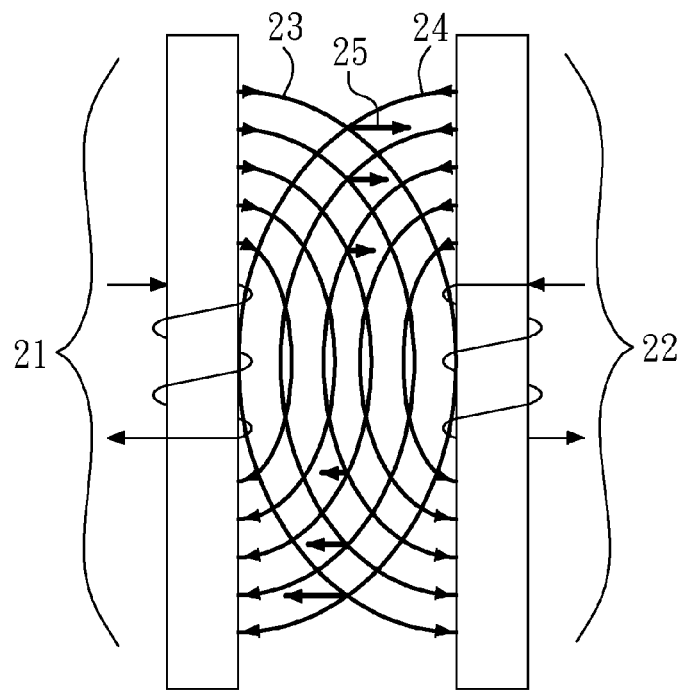
FIG. 2A and FIG. 2B illustrate qualitatively the magnetic field, the Lorentz force and how the ion beam is adjusted according to the conventional control assembly having two straight bar magnets.

FIG. 2A illustrates qualitatively both the magnetic field flux and the magnetic field induced by two conventional straight bar magnets as shown in FIG. 1A. Herein, two straight bar magnets 21 and 22 are located on two opposite sides of a predetermined ion path so that an adjustment space is partially surrounded. Moreover, one straight bar magnet 21 has disposed clockwise coils and another straight bar magnet 22 has disposed counter-clockwise coils, and the current directions (expressed by arrow) through the two coils are opposite when the current amount is same. Further, to simplify the figures, the cross-sectional shape of the ion beam is expressed as a rectangular. Therefore, two sets of magnetic fields are induced with essentially opposite directions (refer to the fluxes 23 and 24) so that a total magnetic field is formed with a specific distribution. Refer to the arrows 25 illustrating qualitatively how the direction and the amplitude of the total magnetic field are varied.

Figure 2B:
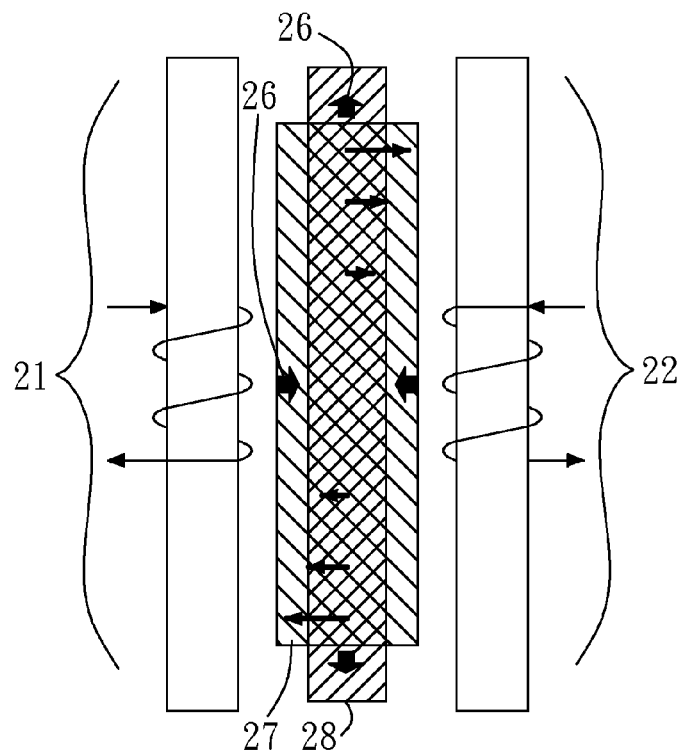

FIG. 2B illustrates qualitatively the corresponding Lorentz force direction on an ion beam travelling into the paper and how the ion beam is elongated along a perpendicular direction and compressed along a horizontal direction. Herein, the arrows 26 show qualitatively how the direction and the amplitude of the Lorentz force are varied. Along the vertical direction (the beam height direction) and the horizontal direction (the beam width direction), the amplitude of the Lorentz force is largest on the edges and lowest on the center of the entered ion beam 27. Accordingly, after the entered ion beam 27 is adjusted by the corresponding Lorentz force applied by the two straight bar magnets 21 and 22, the exited ion beam 28 is elongated along the vertical direction and compressed along the horizontal direction. In other words, the ion beam becomes narrower and taller after traveling through the adjustment space partially surrounded by the two straight bar magnets 21 and 22.

Figure 3A:
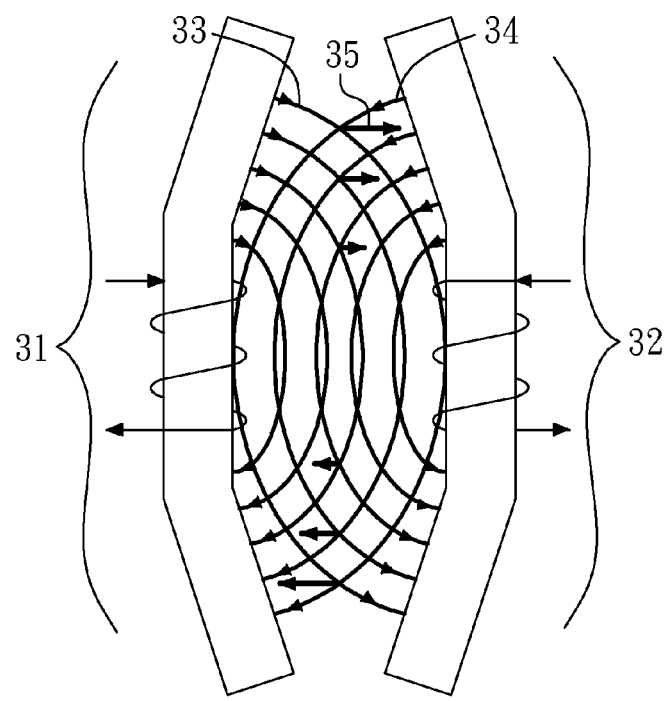
FIG. 3A and FIG. 3B illustrate qualitatively the magnetic field, the Lorentz force and how the ion beam is adjusted according to one embodiment of the present invention having two concave bar magnets.
Figure 3B:
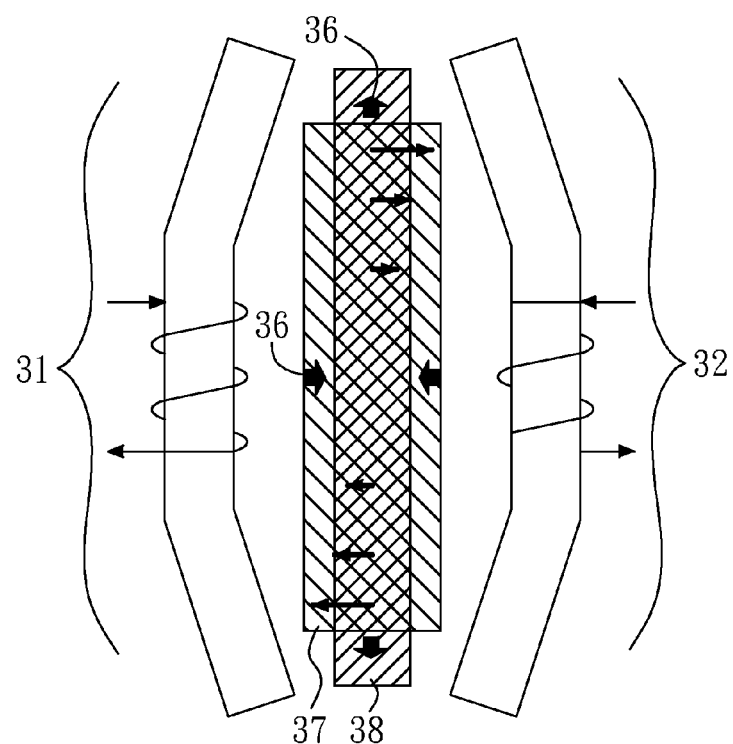

As illustrated qualitatively in FIG. 3A and FIG. 3B, one embodiment of the invention uses two concave bar magnets 31/32 to replace the two conventional straight bar magnets 21/22. The distance between the neighboring top ends (or neighboring bottom ends) of the two concave bar magnets 31/32 is equal to the distance between the two straight bar magnets 21/22, and the two concave bar magnets 31/32 are symmetrical around a centerline of a gap between the two concave bar magnets 31/32. Herein, a concave bended bar magnet indicates that a midpoint of the concave bended bar magnet is farther from the centerline of the gap than two ends (even other portions) of the concave bended bar magnet.

Reasonably, due to the wider gap width at the middle portion of the gap, the distribution of the two sets of magnetic fields (refer to the fluxes 33 and 34) induced respectively by the two concave bar magnets 31/32 will be less densely in the middle portion of the gap than that induced by the two straight bar magnets 21/22, when the distribution of the two sets of magnetic fields (refer to the fluxes 33 and 34) induced respectively by the two concave bar magnets 31/32 in the top/bottom ends of the gap will be essentially similar with that induced by the two straight bar magnets 21/22. Accordingly, the total magnetic field 35 is weaker in the middle comparing to the total magnetic field 35 close to the top and bottom ends of the two concave bar magnets 31/32, so that the ion beam tends to be compressed less along horizontal direction than to be elongated along vertical direction by the Lorentz force 36. Therefore, the exited ion beam 38 is taller and less narrower than the entered ion beam 37 after the entered ion beam 37 traveling through the adjustment space partially surrounded by the concave bar magnets 31/32. Especially, to compare with the FIG. 2B, the exited ion beam is wider than the exited ion beam 28, which is a main characteristic of this embodiment.

Figure 4A:
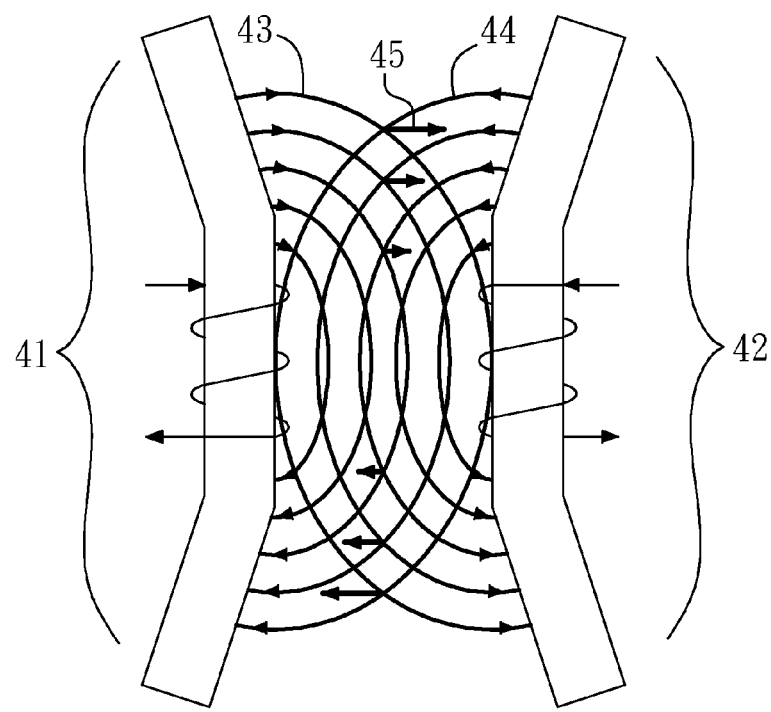
FIG. 4A and FIG. 4B illustrate qualitatively the magnetic field, the Lorentz force and how the ion beam is adjusted according to one embodiment of the present invention having two convex bar magnets.
Figure 4B:
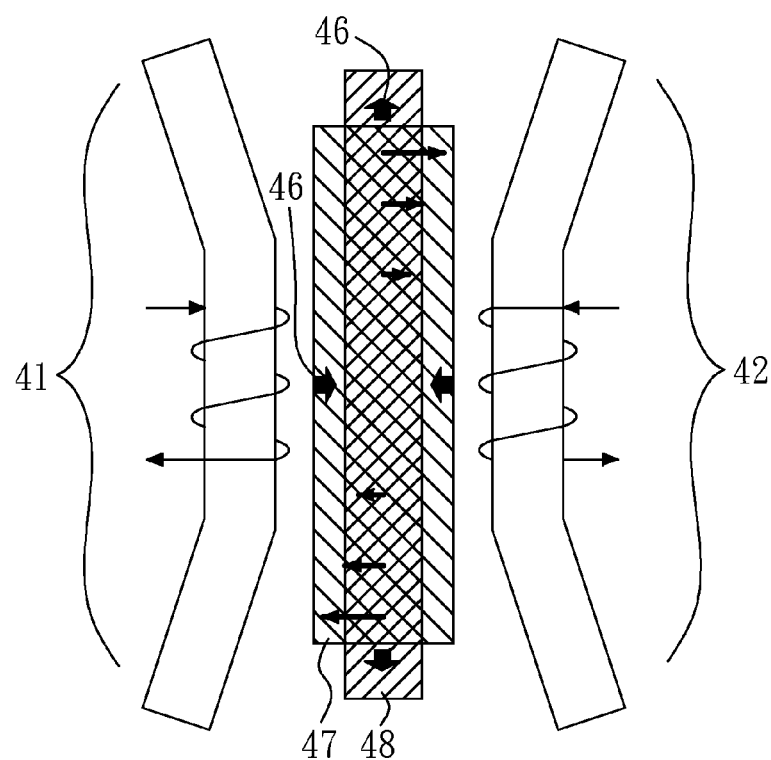

As illustrated qualitatively in FIG. 4A and FIG. 4B, another embodiment of the invention uses two convex bar magnets 41/42 to replace the two conventional straight bar magnets 21/22. The distance between the middle portions of the two convex bar magnets 41/42 is equal to the distance between the two straight bar magnets 21/22, and the two convex bar magnets 41/42 are symmetrical around a centerline of a gap between the two convex bar magnets 41/42. Herein, a convex bended bar magnet indicates that the midpoint of the convex bended bar magnet is closer to the centerline of the gap than the two ends (even other portions) of the convex bended bar magnet.

Reasonably, due to the opposite geometric characteristic, the effect of the convex bar magnets 41/42 is opposite to the effect of the concave bar magnets 31/32. Hence, due to the larger gap width at the top/bottom portions of the gap, to compare with the distribution of the magnetic field induced by the straight bar magnets 21/22, the distribution of the two sets of magnetic fields (refer to the fluxes 43 and 44) induced respectively by the two convex bar magnets 41/42 will be less densely in the top/bottom portions of the gap but will be essentially similar with in the middle portions of the gap. Accordingly, the total magnetic field 45 is weaker in the top/bottom portions comparing to the total magnetic field 45 in the middle portion. Therefore, the exited ion beam 48 is narrower and taller than the entered ion beam 47, after the entered ion beam 47 traveling through the adjustment space partially surrounded by the convex bar magnets 41/42 and being adjusted by the Lorentz force 46. Especially, to compare with the FIG. 2B, the exited ion beam 38 is shorter than the exited ion beam 28, which is a main characteristic of this embodiment.

Besides, in the above embodiments, except that the shape of the bar magnets is changed, other parameters are kept as constant as possible. For example, the current flowing the coils disposed on different bar magnets with same direction and same amount, the density and the outline of the coils disposed on different bar magnets are equivalent, the two bended bar magnets are symmetric around a centerline of the gap there between, the shape of each bar magnet is a combination of three straight segments, the distance between two bended bar magnets is equal essentially to the distance between two straight bar magnets, and so on. However, all these parameters may be adjusted without violating the mechanism of the bended bar magnets. For example, other non-illustrated embodiments may have two concave bar magnets where the distance between the middle portions of the two concave bar magnets is equal to the distance between the two straight bar magnets 21/22, and may have two convex bar magnets where the distance between the neighboring top ends (or neighboring bottom ends) of the two convex bar magnets is equal to the distance between the two straight bar magnets 21/22.

Figure 5:
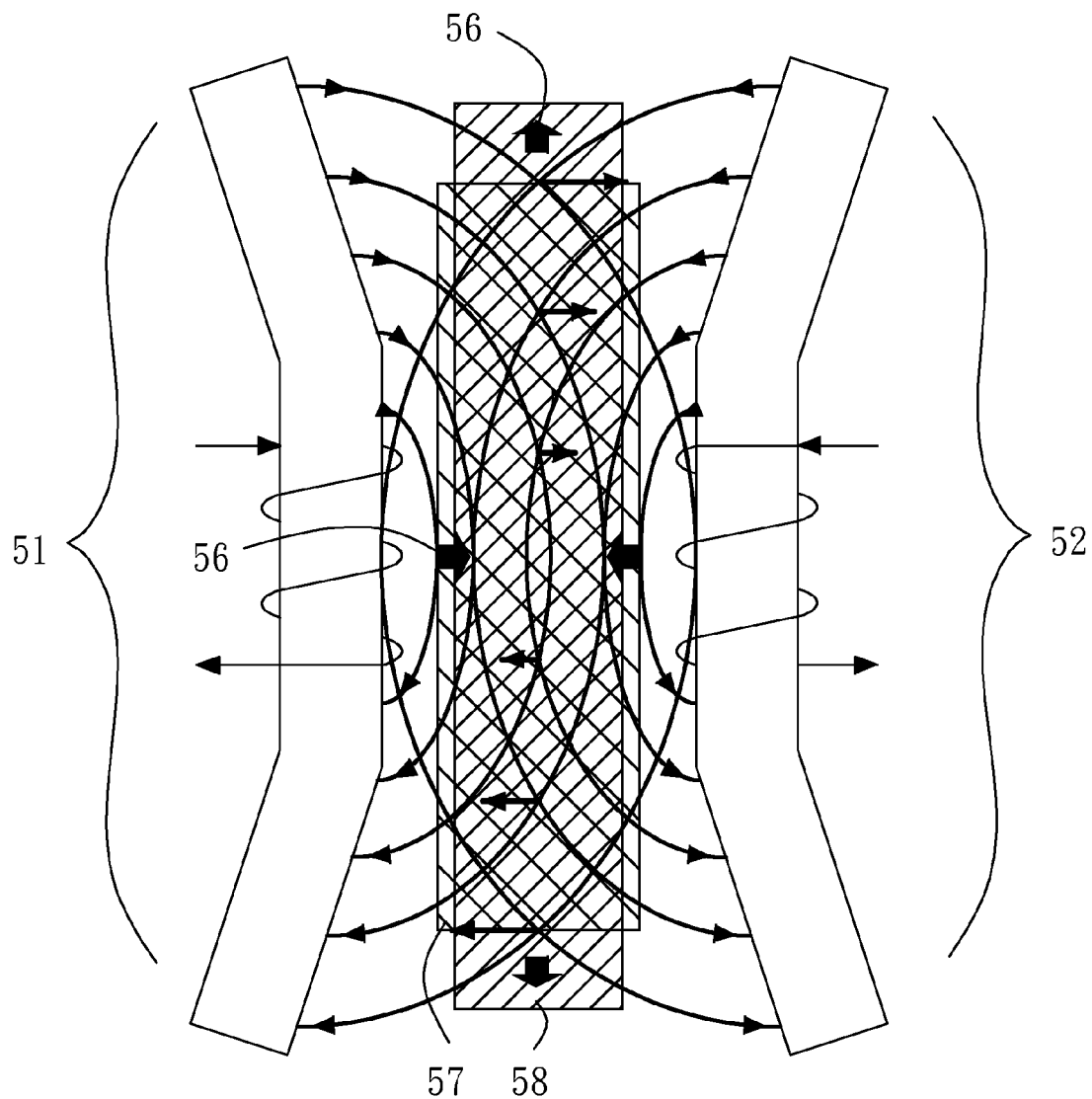
FIG. 5 illustrates qualitatively how the ion beam is adjusted according to one embodiment of the present invention being similar with the embodiment shown in FIGS. 4A and 4B except the gap width is twice as large.

FIG. 5 illustrates qualitatively an embodiment being similar with the embodiment shown in FIGS. 4A and 4B except the gap width is twice larger. Herein, similar items are labeled by similar numbers, and the related description is omitted. Clearly, the relative strength of horizontal and perpendicular Lorentz forces is changed when the gap width between two bar magnets is adjusted. Hence, the ratio of amplitudes of an ion beam elongation and compression along horizontal and perpendicular direction is correspondingly changed after the ion beam traveling through the bar magnets. As shown in FIG. 5, the larger gap width induces a less densely magnetic field, so that a less narrower and less taller exited ion beam 58 is acquired.

As a short summary, the embodiments shown in FIG. 3A to FIG. 5 may be applied to adjust the size, especially the ratio between the horizontal direction and the perpendicular direction, of an ion beam. Hence, even the operations of both the ion source and the mass analyzer are fixed, the size/shape of the final ion beam implanted to the workpiece may be adjusted flexibly to meet the different requirements of different implantations.

Figure 6:
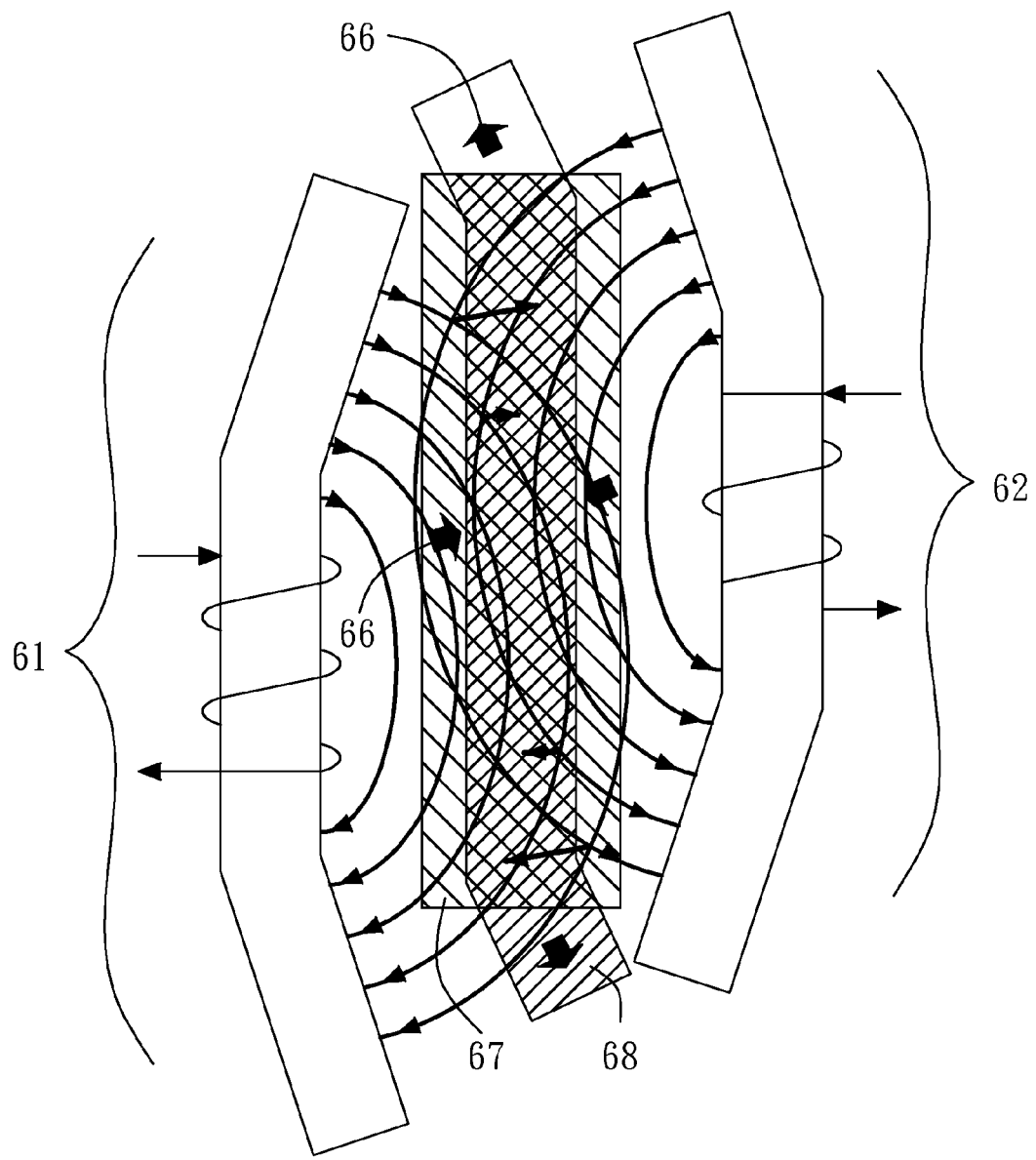
FIG. 6 and FIG. 7 illustrate qualitatively two embodiments of the present invention being similar with the embodiment shown in FIGS. 4A and 4B except the two bended bar magnets are not symmetric around the centerline of the gap between the two bended bar magnets.
Figure 7:
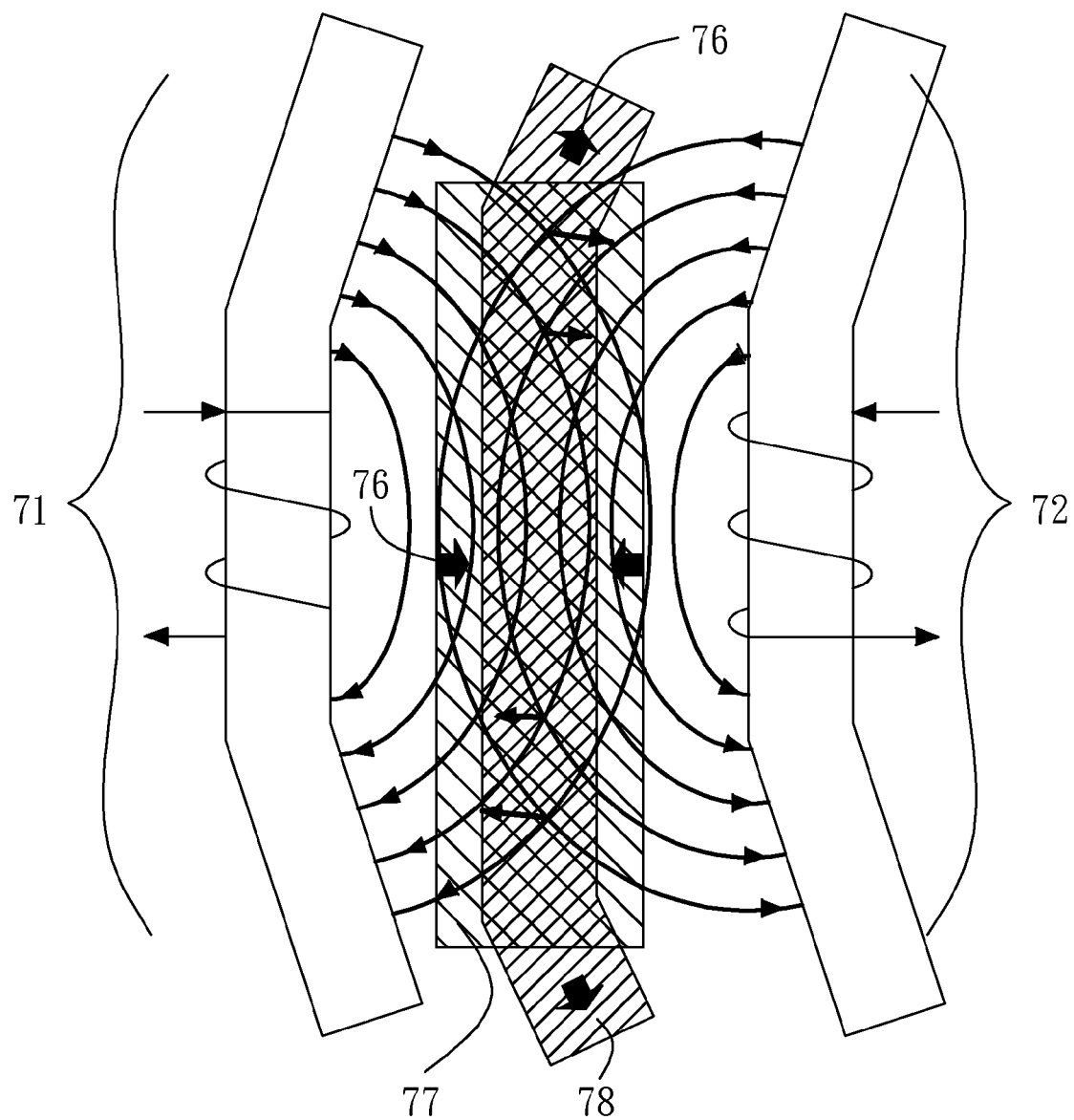

FIG. 6 and FIG. 7 illustrate qualitatively two embodiments being similar with the above embodiments except that the two bended bar magnets are not symmetric around the centerline of the gap between the two bended bar magnets. Herein, FIG. 6 shows the situation that the bended bar magnets 61/62 are asymmetric distributed around the centerline of the gap, and FIG. 7 shows the situation that two bended bar magnets 71/72 are concave and convex respectively. Again, similar items are labeled by similar numbers, and the related description is omitted. Reasonably, due to the specific configuration of the bended bar magnets 61/62/71/72, the ion beam will deviate from the symmetric ion beam axis so that the ion beam shape will be changed non-symmetrical. In the situation shown in FIG. 6, the asymmetric concave bar magnets 61/62 changes the size of the entered ion beam 67 and twists slightly the entered ion beam 67 as well, so that the exited ion beam has a taller, less narrower and deformed shape. In the situation shown in FIG. 7, the concave and the convex bar magnets 71 and 72 changes the size of the entered ion beam 77 and bends the entered ion beam 77 slightly at both top and bottom portions of the entered ion beam 77, so that the exited ion beam 78 has a more obvious curvature than the entered ion beam 77.

Reasonably, the embodiments shown in FIG. 6 and FIG. 7 may be applied to improve the ion beam outputted from the mass analyzer even the operations of both the ion source and the mass analyzer are fixed. For example, a twisted ion beam outputted from the mass analyzer may be straightened by the situation shown in FIG. 6 and a banana ion beam outputted from the mass analyzer may be straightened by the situation shown in FIG. 7.

Furthermore, for some ion implantation applications, the ion beam outputted from the mass analyzer has to be non-uniformly adjusted before the workpiece being implanted. For example, the cross-sectional shape of the outputted ion beam is partially non-uniform, so that a non-uniform adjustment is useful to separately elongate/compress different portions of the outputted ion beam for achieving an adjusted ion beam with a more uniform cross-sectional shape. In such condition, different coils of the conventional straight bar magnets have to be electrically coupled with different current sources, so that different coils may generate different magnetic fields with different amplitudes. Then, even these coils are disposed along two straight lines, the net magnetic field generated by the two straight bar magnets may be non-uniformly distributed. In contrast, because the coils of the bended bar magnets are not disposed along two straight lines, the net magnetic field generated by the two bended bar magnets may be non-uniformly distributed even the amplitude of the magnetic fields induced by different coils may be uniformly, or only slightly non-uniform. In other words, these coils of each bended bar magnet may be electrically coupled with one and only one power source, or may be electrically coupled with a few power sources.

Accordingly, to compare with the conventional straight bar magnets, the proposed bended bar magnets may reduce the cost and simplify the operation because less power sources being required, at least may provide an alternative option on the design/operation of the ion implanter.

Figure 8A:
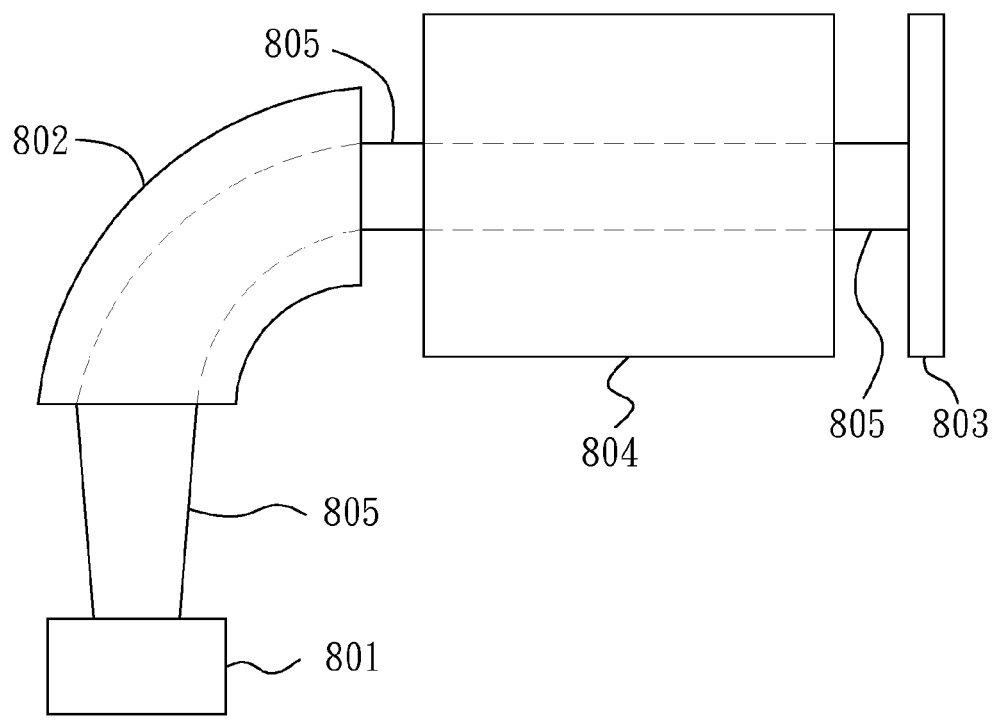
FIG. 8A and FIG. 8B illustrate quantitatively an ion implanter uses the proposed bended bar magnets.
Figure 8B:
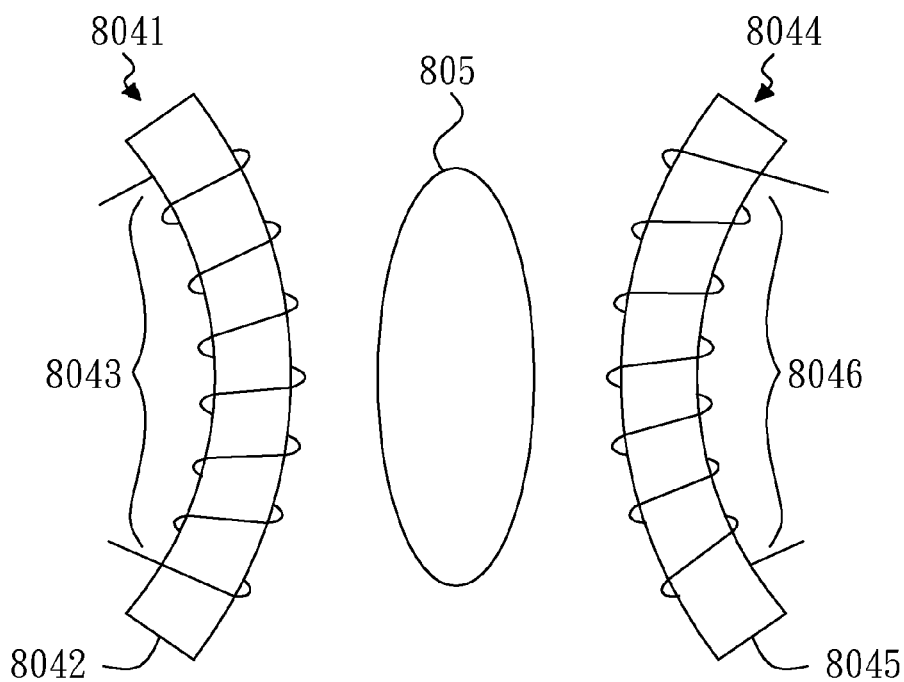

FIG. 8A and FIG. 8B illustrate quantitatively an ion implanter uses the proposed bended bar magnets. The proposed ion implanter 800 has at least an ion source 801 capable of generating an ion beam 805, a mass analyzer 802 capable of directing the ion beam 805 (ribbon beam, spot beam or any type ion beam) with numerous ions having desired mass-to-charge ratio, a substrate holder 803 capable of holding a workpiece (not shown) to be implanted by the ion beam 805, and a control assembly 804 capable of adjusting the ion beam 805 in an adjustment space between the mass analyzer 802 and the substrate holder 803. Moreover, each of the ion source 801, the mass analyzer 802 and the substrate holder 803 may be manufactured by the conventional technologies and then are not further discussed. Besides, the control assembly 804 has at least a first bended bar magnet 8041 having a first bended support rod 8042 and one or more coils 8043 dispensed on the first bended support rod 8042 with one or more first currents flowing through said first coils, and a second bended bar magnet 8044 having a second bended support rod 8045 and one or more coils 8046 dispensed on the second bended support rod 8045 with one or more second currents flowing through said first coils. The first bended bar magnet 8041 is at a gap from the second bended bar magnet 8044, so that the adjustment space is formed between the two bended bar magnets 8041/8044.

In this embodiment, both bended bar magnets 8041/8042 are convex and bended continuously. However, as shown in FIG. 3A to FIG. 7 and discussed above, the bended bar magnets used to form the control assembly 804 are not limited by the shape, the size, the gap width, the construction, and so on. For example, each of the bended bar magnet 8041/8042 may have an arc shape, a curve shape, a zigzag shape, or a shape consisting of several straight segments. For example, the curvature of the bended bar magnet is not limited.

Figure 9A:
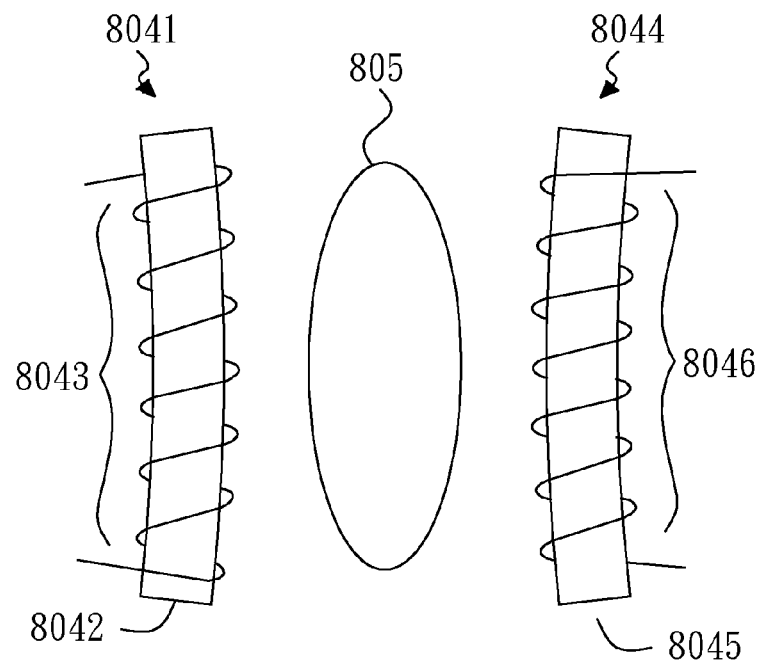
FIG. 9A and FIG. 9B illustrate qualitatively two embodiments of the present invention having different curvatures of the two bended bar magnets.
Figure 9B:
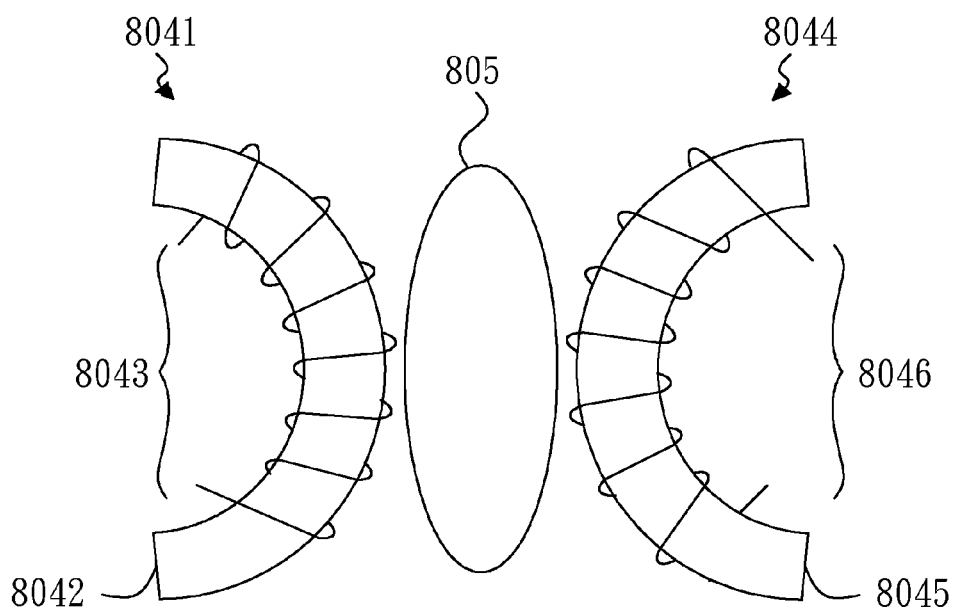

FIG. 9A and FIG. 9B illustrate qualitatively two embodiments with bended bar magnets of different bending curvature. Both control assemblies in these two embodiments have convex bar magnets 8041/8044 with uniformly disposed coils, but the curvature of the convex bar magnets 8041/8044 in FIG. 9A is clearly smaller than that in FIG. 9B. Differences in the curvature will directly affect the magnetic field distribution in the region surrounded by two magnet bars at same coil current. Hence, the deformation ratio on the ion beam shape between the perpendicular direction and the horizontal direction of the ion beam 805, as illustrated in FIGS. 9A and 9B, will be different. In other words, different adjustments on the ion beam may be achieved by using different control assemblies having bended bar magnets with different curvatures.

Reasonably, even not illustrated in any drawing, to use lesser power source(s) to supply current(s) to more coils on the bended bar magnets, the control assembly 804 may be configured according to at least one of the following: these first coils are electrically coupled with one and only one first power source, these first coils are electrically coupled with two or more first power sources, these second coils are electrically coupled with one and only one second power source, and these second coils are electrically coupled with two or more second power sources. Also, the control assembly 804 may be configured according to at least one of the following: different first power sources are separately operated (each provides an individual current), different second power sources are separately operated (each provides an individual current), these first power sources and these second power sources are separately operated (each provides an individual current), these first power sources behaves as one and only one power source (all provide the same current), these second power sources behave as one and only one power source (all provide the same current), and both these first power sources and these second power sources behaves as one and only one power source (all provide the same current).

In addition, although not shown in any drawing, some embodiments may adjust flexibly the shape of one or more bended bar magnets. In other words, one or more bended bar magnets may have an adjustable shape, so that the control assembly may be more suitable for many different adjusted ion beams required by different ion implantations. The adjustments of the bended bar magnet(s) may be achieved when the ion implanter is performance maintained or during the operation of the ion implanter. How to adjust the shape of the bended bar magnet(s) is not limited. For example, it may be achieved by replacing an original bended bar magnet by a new bended bar magnet, and it may be achieved by rotating the bearing used to mechanically connect different segments of one bended bar magnet.

Of course, to more flexibly adjust the ion beam, some other embodiments without any drawings may adjust other parameters, but not adjust the shape of the bended bar magnet(s). For example, the gap width between neighboring bended bar magnets may be adjusted flexibly, the curvature of each bended bar magnet may be adjusted flexibly, even the current flowing through each bended bar magnet may be adjusted flexibly. It should be noted that two or more parameters may be adjusted flexibly simultaneously or in sequence.

Moreover, whether the coils are disposed uniformly or non-uniformly on any bended bar magnet also is not limited. Different configuration of the disposed coils may be used to induce different induced magnetic fields. Note that different current amounts flowing through the coils may change directly the amplitude of the induced magnetic field but the configuration of the coils on the bended bar magnet(s) may control directly how the induced magnetic field is distributed.

Further, although not shown in any drawings, some embodiments may non-uniformly turn on (or turn off) one or more of the coils disposed on one or more bended support rod. Hence, to compare with the situation having disposed uniformly coils on same bended support rod, the total magnetic field induced by the control assembly may have more different variations, even may be adjusted more flexibly. Accordingly, the available adjustments on the ion beam passing through the adjustment space are significantly increased.

Although specific embodiments have been illustrated and described, it will be appreciated by those skilled in the art that various modifications may be made without departing from the scope of the present invention, which is intended to be limited solely by the appended claims.

What is claimed is:

1. An ion implanter, comprising:
   an ion source capable of generating an ion beam;
   a mass analyzer capable of analyzing said ion beam;
   a substrate holder capable of holding a workpiece to be implanted by said ion beam; and
   a control assembly capable of adjusting said ion beam in an adjustment space between said mass analyzer and said substrate holder, said control assembly comprising:
   a first bended bar magnet having a first bended support rod and one or more first coils dispensed on said first bended support rod with one or more first currents flowing through said first coils; and
   a second bended bar magnet having a second bended support rod and one or more second coils dispensed on said second bended support rod with one or more second currents flowing through said second coils;
   wherein said control assembly is configured according to at least one of the following:
   a first curvature of said first bended bar magnet being adjustable;
   a second curvature of said second bended bar magnet being adjustable;
   said first bended bar magnet having an adjustable shape; and
   said second bended bar magnet having an adjustable shape;
   wherein said first bended bar magnet is at a gap from said second bended bar magnet to form said adjustment space between said bended bar magnets.

2. The ion implanter as set forth in claim 1, wherein a width of said gap is adjustable.

3. The ion implanter as set forth in claim 1, wherein at least one of said first current and said second current is adjustable.

4. The ion implanter as set forth in claim 1, said control assembly being configured, according to one of the following:
   said first bended bar magnet and said second bended bar magnet being symmetrical around a centerline of said gap; and
   said first bended bar magnet and said second bended bar magnet being asymmetrical around said centerline of said gap.

5. The ion implanter as set forth in claim 1, said control assembly being configured according to at least one of the following:

said first bended bar magnet being concave so that a midpoint of said first bended bar magnet is farther from a centerline of said gap than the two ends of said first bended bar magnet; and said second bended bar magnet being concave so that a midpoint of said second bended bar magnet is farther from said centerline of said gap than the two ends of said second bended bar magnet;

said first bended bar magnet being convex so that a midpoint of said first bended bar magnet is closer to said centerline of said gap than said two ends of said first bended bar magnet; and said second bended bar magnet being convex so that a midpoint of said second bended bar magnet is closer to said centerline of said gap than said two ends of said second bended bar magnet.

6. The ion implanter as set forth in claim 1, said control assembly being configured according to at least one of the following:

said first bended bar magnet having an arc shape;
said second bended bar magnet having an arc shape;
said first bended bar magnet having a curved shape;
said second bended bar magnet having a curved shape;
said first bended bar magnet having a zigzag shape; and
said second bended bar magnet having a zigzag shape.

7. The ion implanter as set forth in claim 1, said control assembly being configured according to at least one of the following:

said first coils being uniformly dispensed on said first bended support rod;
said first coils being non-uniformly dispensed on said first bended support rod;
said second coils being uniformly dispensed on said second bended support rod; and
said second coils being non-uniformly dispensed on said second bended support rod.

8. The ion implanter as set forth in claim 1, said control assembly being configured according to at least one of the following:

said first coils being electrically coupled with a first power source;
said first coils being electrically coupled with two or more said first power sources;
said second coils being electrically coupled with a second power source; and
said second coils being electrically coupled with two or more said second power sources.

9. The ion implanter as set forth in claim 8, said control assembly being configured according to at least one of the following:

different said first power sources being separately operated;
different said second power sources being separately operated;
said first power sources and said second power sources being separately operated;
said first power sources behaving as one and only one power source;
said second power sources behaving as one and only one power source; and
said first power sources and said second power sources behaving as one and only one power source.

\* \* \* \* \*